United States Patent
Lim et al.

(10) Patent No.: US 8,890,533 B2
(45) Date of Patent: Nov. 18, 2014

(54) APPARATUS FOR INSPECTING LIGHT EMITTING DIODE PACKAGE AND INSPECTING METHOD USING THE SAME

(75) Inventors: Ssang Gun Lim, Daejeon (KR); Seung Gyu Ko, Daejeon (KR); Dae Kab Kwon, Seoul (KR); Ju Hun An, Chungcheongbuk-do (KR); Won Soo Ji, Gyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 203 days.

(21) Appl. No.: 12/957,931

(22) Filed: Dec. 1, 2010

(65) Prior Publication Data

US 2011/0128004 A1    Jun. 2, 2011

(30) Foreign Application Priority Data

Dec. 1, 2009    (KR) .................. 10-2009-0117953

(51) Int. Cl.
*H01L 21/00* (2006.01)
*H01L 21/67* (2006.01)
*G09G 3/14* (2006.01)

(52) U.S. Cl.
CPC .... *H01L 21/67271* (2013.01); *H01L 21/67259* (2013.01); *H01L 21/67294* (2013.01); *H01L 21/67282* (2013.01); *G09G 3/14* (2013.01)
USPC ........................................ 324/414

(58) Field of Classification Search
USPC ........................................ 324/414
See application file for complete search history.

(56) References Cited

U.S. PATENT DOCUMENTS

| | | | |
|---|---|---|---|
| 5,046,389 A * | 9/1991 | Thompson et al. ............. 83/140 |
| 5,226,361 A | 7/1993 | Grant et al. |
| 6,431,814 B1 | 8/2002 | Christensen et al. |
| 6,550,133 B1 * | 4/2003 | Seo et al. ......................... 29/741 |
| 6,839,056 B2 * | 1/2005 | Nagai et al. .................... 345/204 |
| 7,332,784 B2 * | 2/2008 | Mills et al. ..................... 257/433 |
| 7,405,093 B2 * | 7/2008 | Andrews ........................ 438/26 |

(Continued)

FOREIGN PATENT DOCUMENTS

| CN | 1575521 A | 2/2005 |
|---|---|---|
| JP | 02-258207 A | 10/1990 |

(Continued)

OTHER PUBLICATIONS

Korean Office Action, with English Translation, issued in Korean Patent Application No. 10-2009-0117953, dated May 30, 2011.

(Continued)

*Primary Examiner* — Jeff Natalini
(74) *Attorney, Agent, or Firm* — McDermott Will & Emery LLP

(57) ABSTRACT

An apparatus for inspecting a light emitting diode (LED) package is provided to inspect an LED to determine whether or not it is defective, and discard the LED when the LED is defective. The apparatus for inspecting an LED package includes: an inspection unit inspecting an LED through a visual inspection to determine whether or not the LED is defective; and a defective product rejection unit discarding the LED when the LED is determined to be defective on the basis of inspection results from the inspection unit among LEDs supplied from the inspection unit. Because the operation of inspecting LEDs and discarding a defective LED are automated and can be rapidly processed as a sequential process, productivity can be improved.

28 Claims, 8 Drawing Sheets

(56) References Cited

U.S. PATENT DOCUMENTS

| | | | |
|---|---|---|---|
| 8,151,657 B2* | 4/2012 | Park | 73/865.8 |
| 2007/0052964 A1* | 3/2007 | Uesugi et al. | 356/430 |
| 2007/0247855 A1* | 10/2007 | Yano | 362/294 |
| 2008/0160658 A1* | 7/2008 | Wang et al. | 438/28 |
| 2009/0040745 A1* | 2/2009 | Nemchuk | 362/84 |

FOREIGN PATENT DOCUMENTS

| | | |
|---|---|---|
| JP | 06-341817 A | 12/1994 |
| JP | 07-276099 A | 10/1995 |
| JP | 11-094759 A | 4/1999 |
| JP | 2001-325587 | 11/2001 |
| JP | 2003-165506 A | 6/2003 |
| JP | 2006-024847 A | 1/2006 |
| JP | 2009-021572 A | 1/2009 |
| KR | 10-2007-0035783 A | 4/2007 |
| KR | 10-2009-0049359 A | 5/2009 |
| KR | 10-2009-0049359 A | 5/2009 |
| WO | WO-03/036718 A2 | 5/2003 |
| WO | WO-2008/126955 A1 | 10/2008 |

OTHER PUBLICATIONS

Korean Office Action, w/ English translation thereof, issued in Korean Patent Application No. KR 10-2010-0122682 dated Mar. 22, 2011.

Extended European Search Report issued in European Patent Application No. EP 10193225.9 dated Mar. 14, 2013.

Chinese Office Action, w/ English translation thereof, issued in Chinese Patent Application No. CN 201010576054.4 dated Jan. 31, 2013.

Chinese Office Action, w/ English translation thereof, issued in Chinese Patent Application No. CN 201010576054.4 dated Oct. 14, 2013.

Japanese Office Action issued in Japanese Application No. 2010-266446, dated May 27, 2014.

\* cited by examiner

US 8,890,533 B2

APPARATUS FOR INSPECTING LIGHT EMITTING DIODE PACKAGE AND INSPECTING METHOD USING THE SAME

CROSS-REFERENCE TO RELATED APPLICATIONS

This application claims the priority of Korean Patent Application No. 10-2009-117953 filed on Dec. 1, 2009, in the Korean Intellectual Property Office, the disclosure of which is incorporated herein by reference.

BACKGROUND OF THE INVENTION

1. Field of the Invention

The present invention relates to an apparatus for inspecting light emitting diode (LED) packages capable of inspecting LEDs to determine whether or not the LEDs are defective and discarding an LED if the LED is defective.

2. Description of the Related Art

A light emitting diode (LED) generates minority carriers (electrons or holes) injected by using a p-n junction structure and emits light according to electron-hole recombination. Namely, when a forward voltage is applied to semiconductor of a particular element, electrons and holes are moved to be recombined through a junction of a positive electrode and a negative electrode, and in this case, a smaller amount of energy is generated than that generated when the electrons and holes are separated, so light is emitted due to the difference between the generated energies.

In line with recent improvements in the luminous efficiency of the LED, the applications thereof extends from an initial LED for displaying signals to an LED for a backlight unit (BLU) for mobile phones, or for an LED to be used as a light source or for the illumination of a flat panel display device such as a liquid crystal display (LCD). The reason for this is because the LED has low power consumption and has a long life span as compared with light bulbs and fluorescent lamps used as conventional sources of illumination.

The LED may be generally fabricated as an LED package. In general, an LED package includes an LED chip, a body on which the LED chip is mounted, and a fluorescent material-containing resin part, such as fluorescent silicon, covering the LED chip at an upper portion of the body. The LED package may further include a Zener diode beside the LED chip.

The LED chip is fabricated by growing semiconductor layers, each having a different conductive type and an active layer for activating light emission between the semiconductor layers, and forming electrodes on the respective semiconductor layers. The LED chip and the Zener diode are electrically connected to a lead frame through wire bonding.

When fluorescent silicon is charged at an upper portion of the LED chip and the Zener diode, if the fluorescent silicon is scantly charged, the internal bonding wire may be exposed and cut off due to heat generation. Conversely, in the case that the fluorescent silicon is excessively charged, when a module is assembled later, assembling may be impossible and a diffusion angle of light may be larger than a set numerical value. Thus, in fabricating the LED package, a process of inspecting a state of a charge in the fluorescent silicon is required.

In the related art, in most cases, an operator inspects the charged state of the fluorescent silicon with his naked eyes and sorts out a defective LED package to discard it. Thus, a skilled operator is required and the manual operation thereof limits an improvement of productivity.

SUMMARY OF THE INVENTION

An aspect of the present invention provides an apparatus for inspecting a light emitting diode (LED) capable of automatically inspecting a defective LED package and discarding it, and quickly performing a sequential process to promote an improvement in productivity.

According to an aspect of the present invention, there is provided an apparatus for inspecting a light emitting diode (LED), including: an inspection unit inspecting an LED through a visual inspection to determine whether or not the LED is defective; and a defective product rejection unit discarding the LED when the LED is determined to be defective on the basis of inspection results from the inspection unit among LEDs supplied from the inspection unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
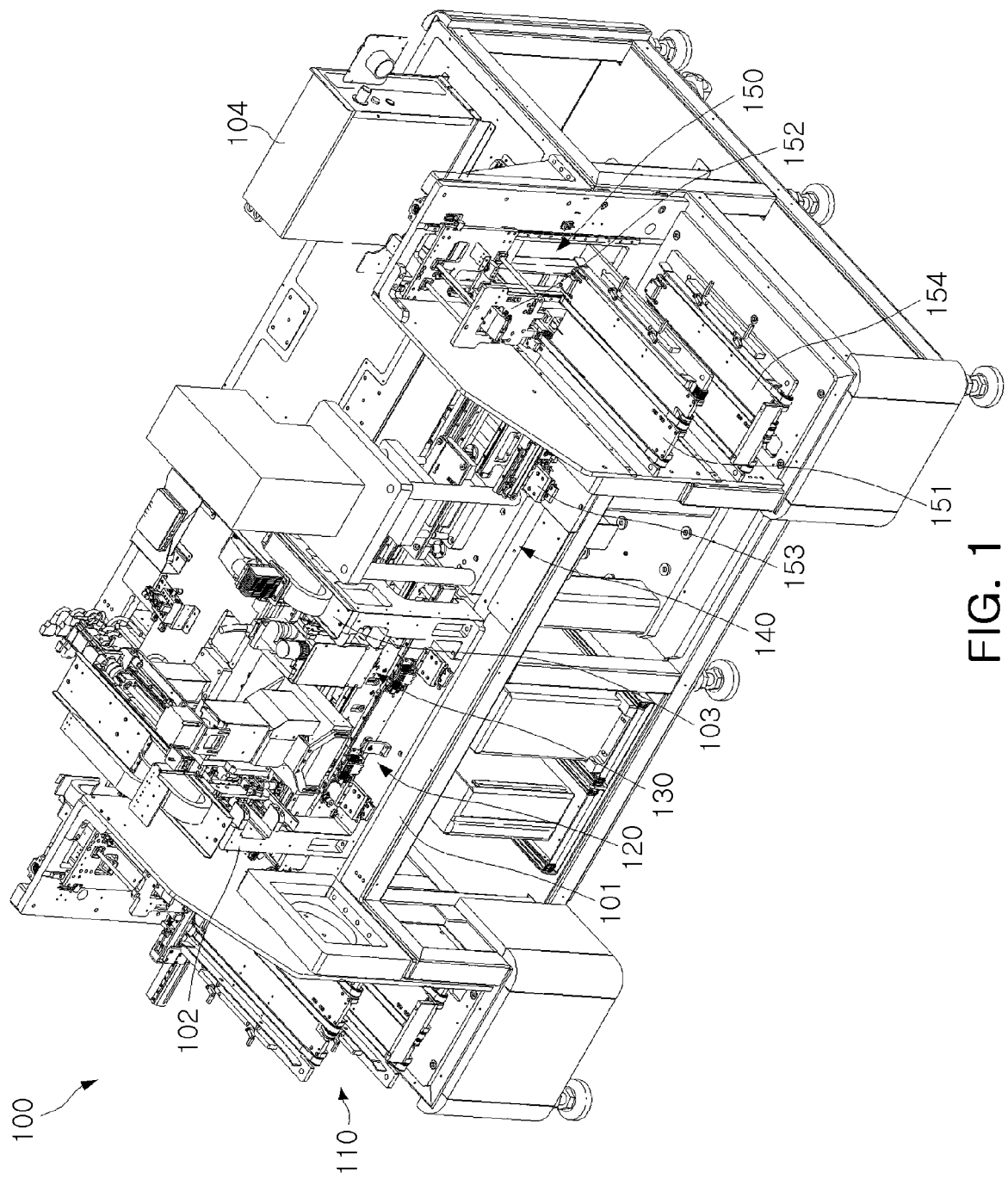
FIG. 1 is a perspective view of an apparatus for inspecting a light emitting diode (LED) according to an exemplary embodiment of the present invention.
Figure 2:
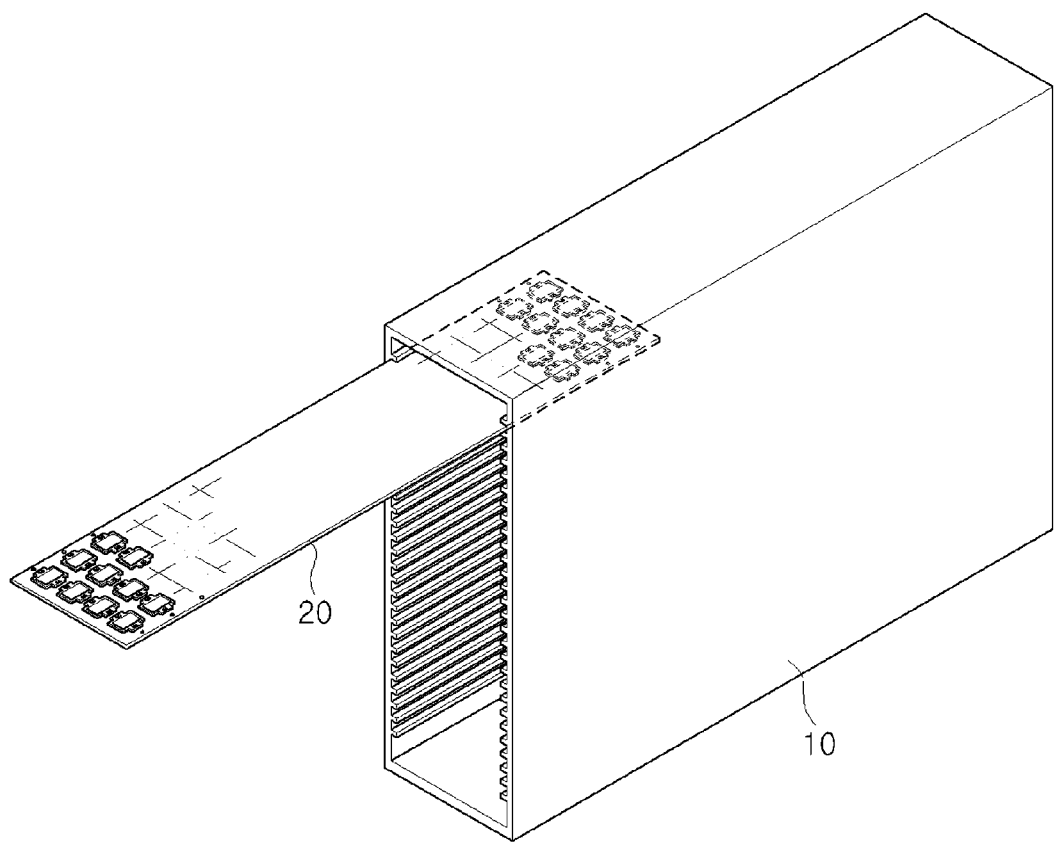
FIG. 2 is a perspective view of a cassette for receiving an LED to be inspected by the inspecting apparatus of FIG. 1.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a perspective view of an apparatus for inspecting a light emitting diode (LED) according to an exemplary embodiment of the present invention.

With reference to FIG. 1, an apparatus for inspecting an LED according to an exemplary embodiment of the present invention may include a loading unit 110, an inspection unit 120, a defective product rejection unit 140, and an unloading unit 150.

The loading unit 110 loads a cassette 10 thereinto. The loading unit 110 may be disposed at one side of a frame 101 adjacent to the inspection unit 120. The cassette 10 has a structure in which a plurality of LED aggregates 20 are received in a stacked manner. The LED aggregate 20 has a structure in which a plurality of LEDs 21 are arranged in the form of an array to have a plurality of rows and a plurality of columns. This is to enhance productivity in fabricating an LED 21. After the fabrication of the LEDs 21 is completed, connection portions of the LEDs 21 of the LED aggregate 20 are cut to separate the LEDs 21.

In the present exemplary embodiment, the LED package is described as an inspection target, but various forms of LEDs, e.g., LED chips or an LED module modularized along with a certain circuit configuration can be also similarly applied.

Figure 3:
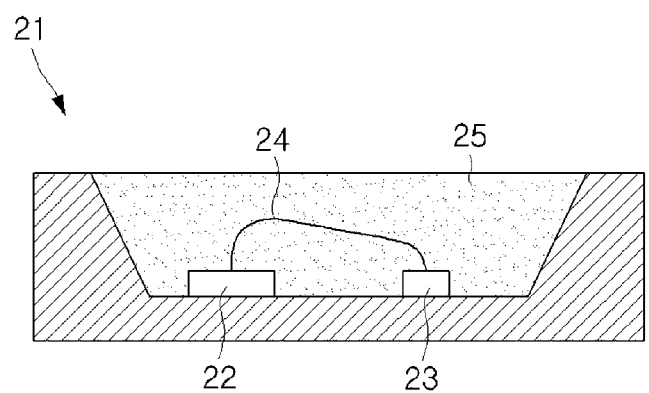
FIG. 3 is a side sectional view of the LED of FIG. 1.

As shown in FIG. 3, each of the LEDs 21 positioned on the loading unit 110 may be configured as an LED package having a structure in which an LED chip 22 and a Zener diode 23 are connected by a bonding wire 24 and a phosphor containing resin part such as a fluorescent silicon 25 covers the upper portion of the LED chip 22 and the Zener diode 23.

The inspection unit 120 receives the LED aggregate 20 from the loading unit 110 and inspects the LEDs 21 of the LED aggregate 20 to determine whether or not they are defective through a visual inspection. For example, the inspection unit 120 processes a captured image of the LED 21 to determine whether the fluorescent silicon 25 of the LED 21 is excessively charged or scantly charged.

To this end, the inspection unit 120 may be configured variably. For example, the inspection unit 120 may include an illumination unit, an image capturing unit, and an image processing unit. The illumination unit irradiates an ultraviolet (UV) ray, of a wavelength at which the fluorescent silicon 25 emits light, to acquire several different images according to charged states of the fluorescent silicon 25. The image capturing unit, which may be a CCD camera or the like, serves to capture an image of an upper surface of the LED 21. The image processing unit may determine a state of the fluorescent silicon 25 by comparing the image captured according to the UV illumination by the image capturing unit with a reference image. The reference image is an image acquired when a charged state of the fluorescent silicon 25 is normal.

The inspection unit 120 may be disposed at an upper side of the LEDs 21. The inspection unit 120 may be supported by a column 102 on the frame 101 such that the inspection unit 120 slidably moves in a direction perpendicular to a direction in which the LED aggregate 20 is supplied. Accordingly, the position of the inspection unit 120 may be adjusted at an inspection area, or the section unit 120 may be moved to a standby position at which the inspection unit 120 is in standby for maintenance or the like.

As described above, the LEDs 21 are arranged in a plurality of rows and a plurality of columns, and may be supplied on a row by row basis. In a case in which a row of LEDs 21 is supplied each time, the inspection unit 120 may capture an image of the LEDs 21 line by line and inspect the same. In another example, when a plurality of rows of LEDs 21 are supplied, the inspection unit 120 may capture an image of the LEDs 21 by region and inspect the same.

Meanwhile, the inspection unit 120 is able to recognize a defect-marked LED which has been determined to have a defective bonding wire 24, among the LEDs 21 of the supplied LED aggregate 20. Namely, before the LED is charged with the fluorescent silicon 25, the LED undergoes a bonding wire inspection, and in this case, if the LED is determined to be defective, the LED may be marked as a defective LED.

When the LED marked as defective because of the defective bonding wire 24 is loaded in the loading unit 110 and then supplied to the inspection unit 120, the inspection unit 120 is able to recognize the LED having the defective bonding wire 24 among LEDs 21 supplied thereto. The information regarding the LED having the defective bonding wire 24 may be provided to the controller 104, and the controller 104 then controls the defective product rejection unit 140 to discard the defective LED.

The defective product rejection unit 140 punches the defective LED among the LEDs 21 of the LED aggregate 20 supplied from the inspection unit 120, and discards it. When the defective product rejection unit 140 receives the LEDs 21, which are arranged in a plurality of rows and a plurality of columns, by one row at a time, the defective product rejection unit 140 may selectively punch defective LEDs among the LEDs 21 constituting each row.

The defective product rejection unit 140 may be controlled, by the controller 104 which has received the information provided from the inspection unit 120, to punch the defective LED to discard it. In this case, the discarded LED may be an LED of which the bonding wire is defective, as well as an LED of which the fluorescent silicon is defective.

The unloading unit 150 loads an empty cassette 10 for receiving the LED aggregate 20 discharged through the defective product rejection unit 140. The LED aggregates 21 received in the empty cassette 10 in the unloading unit 150 may be sent to a module assembling process.

According to the apparatus 100 for inspecting an LED package, constructed as described above, the process of inspecting the LED 21 and the process of discarding an LED determined to be defective according to the inspection results in the fabrication process of the LED 21 can be automated, and the inspecting process and the discarding process can be quickly performed as a sequential process. Thus, the productivity in fabricating the LED 21 can be improved.

The apparatus 100 for inspecting an LED package may further include a defective product marking unit 130 between the inspection unit 120 and the defective product rejection unit 140. The defective product marking unit 130 may mark the LED, which has been determined to be defective on the basis of the inspection results from the inspection unit 120, as defective. The defective product marking unit 130 may be disposed at an upper side of the LEDs 21 which have been supplied. The defective product marking unit 130 may be supported by a column 103 on the frame 101 such that it can slidably move in a direction perpendicular to the direction in which the LED aggregate 20 is supplied. Accordingly, the defective product marking unit 130 may be adjusted in its position in a marking area or may moved to a standby position for maintenance, or the like.

The defective product marking unit 130 may be configured to carve a stamp of a defective mark on the surface of the defective LED 21 by irradiating a laser beam thereonto. In this case, when the LEDs 21, which are arranged in a plurality of rows and columns, are supplied by one row at a time, the defective product marking unit 130 may mark the defective LED as defective while moving a laser beam only in a direction perpendicular to the direction in which the LEDs 21 are supplied. For another example, the defective product marking unit 130 may mark the defective LED as defective while moving the laser beam in an X-Y direction. The movement and operation of the laser beam may be performed by the controller 140 which has received the information provided from the inspection unit 120. The controller 104 may be a computer or the like. For another example, the defective product marking unit 130 may be configured to print a defect mark on the surface of the defective LED 21 by jetting ink thereonto.

Figure 4:
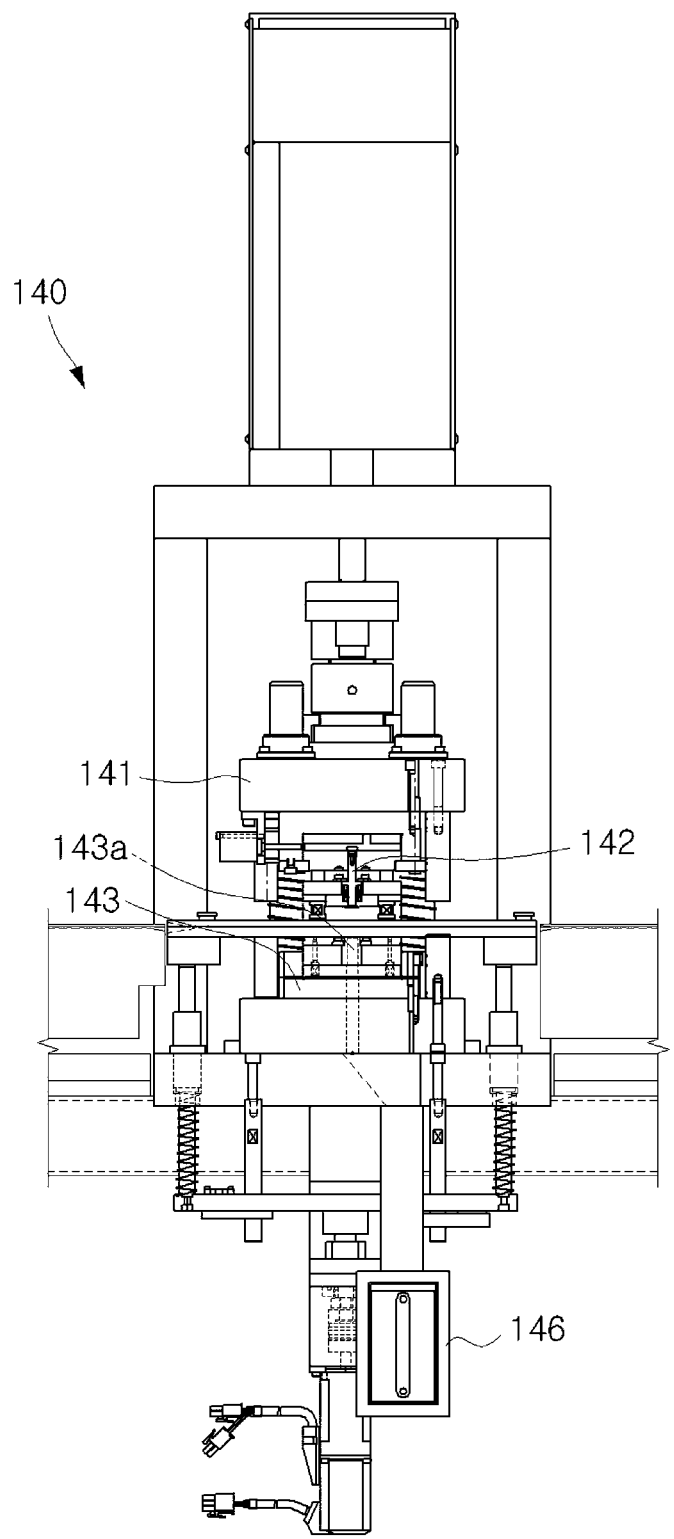
FIG. 4 is a front view of a defective product rejection unit.
Figure 5:
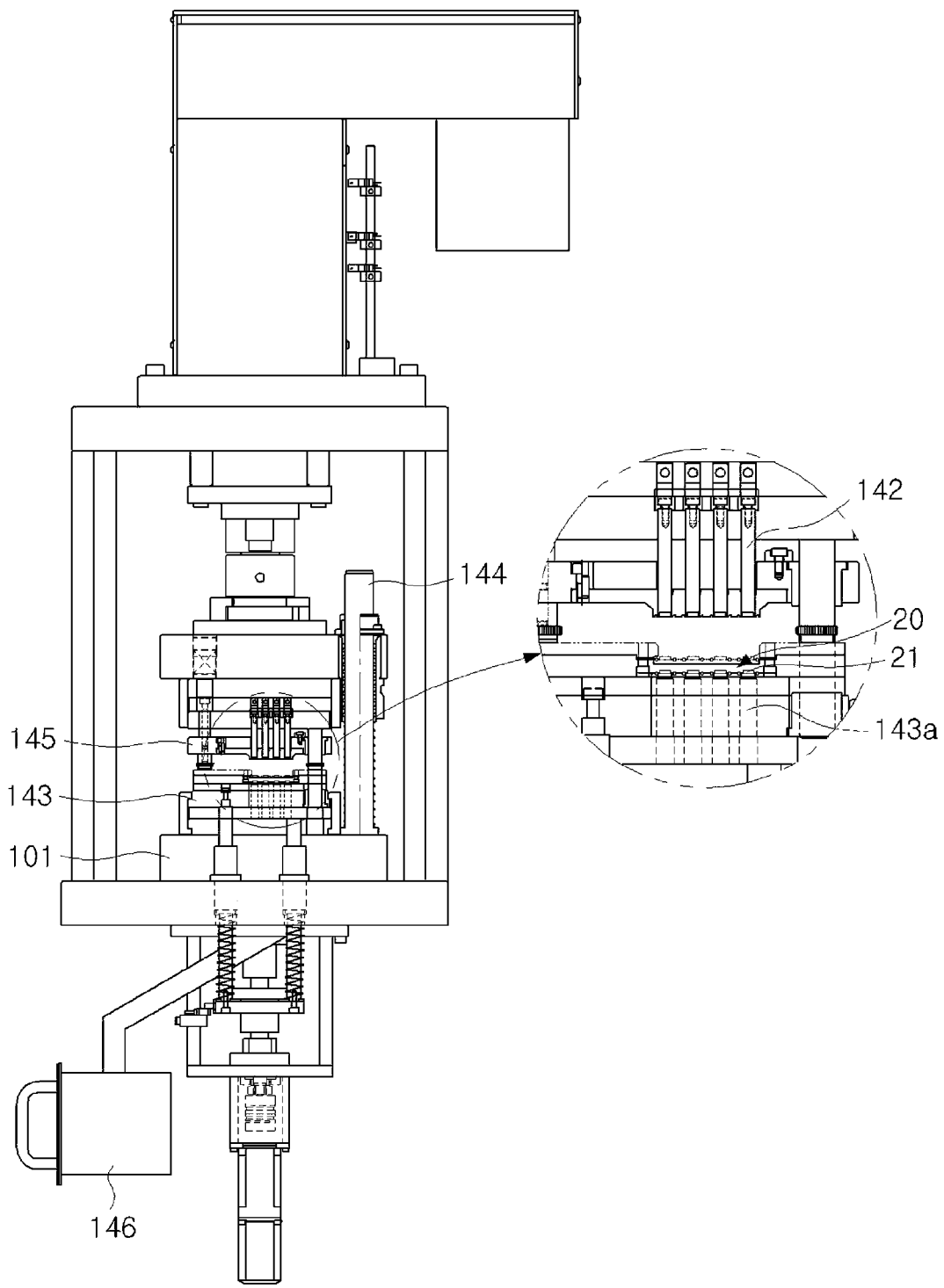
FIG. 5 is a side view of the defective product rejection unit of FIG. 4.

The defective product rejection unit 140 may be configured variably. For example, the defective product rejection unit 140 may be configured as shown in FIGS. 4 and 5. With reference to FIGS. 4 and 5, the defective product rejection unit 140 includes a punching head 141, punching pins 142, and a punching support 143.

The punching head 141 is driven to ascend or descend. The punching head 141 descends to punch a defective LED by means of the punching pin 142 corresponding to the defective LED. The punching head 142 may be driven to ascend or descend by means of a driving unit including a cylinder such as a pneumatic cylinder or the like. A portion of the punching head 141 may be inserted into a guide bar 144 installed at the frame 101 so as to guide the ascending or descending operation of the punching head 141. Here, in order to reduce a driving load when the punching head 141 ascends after a punching operation, a compression coil spring may be mounted on the guide bar 144.

The punching pins 142 are arranged to correspond to one row of LEDs 21 of the LED aggregate 20 being supplied. For example, when one row of LEDs 21 includes four LEDs 21, four punching pins 142 are provided to correspond to the LEDs 21 in a one-to-one manner. The punching pins 142 are installed in the punching head 142 such that they driven to ascend and descend. The punching pins 142 may be driven to ascend and descend by a driving unit including a cylinder such as a pneumatic cylinder or the like. The punching pins 142 may be inserted into guide holes 145 installed between the punching pins 142 and the punching support 143 to ensure a stable ascending and descending operation.

In relation to a defective LED, the punching pins 142 are maintained to be protruded toward the defective LED, so that when the punching head 141 descends, the defective LED can be pressed to be punched. In relation to a flawless LED, although the punching head 141 descends to a lower dead center, it is maintained to be spaced apart from the flawless LED. Thus, although the punching head 141 descends, the flawless LED cannot be punched.

The punching support 143 supports the LED aggregate 20 at a lower side of the punching pines 142. The punching pins 142 are inserted into the punching support 143. The punching pins 142 include discharge holes 143a through which the punched LED is discharged. Namely, when the punching pins 142 descend for a punching operation, they are inserted into the discharge holes 143a, and in this process, the punched LED is pressed by the punching pins 142 so as to be put into the discharge holes 143a. Thereafter, the punched LED is dropped from the discharge hole 143a so as to be collected in a waste box 146.

The punching support 143 may be configured to be driven to descend by a pre-set distance to reduce an impact for the punching operation of the punching head 141. Namely, when the lower ends of the punching pins 142 are about to be brought into contact with the defective LED according to a descending operation of the punching head 141, the punching support 143 descends by a shorter distance than that of a stroke of the punching pins 141, thus reducing an impact applied to the LED aggregate 20 in the punching process. The punching support 143 may ascend and descend according to a forward and reverse rotation of a rotary motor by a driving unit including the rotary motor and a linear movement conversion unit converting a rotational movement of the rotary motor into a linear movement. The ascending and descending operation of the punching support 143 may be guided by at least a pair of guide bars 147. Here, in order to reduce a driving load when the punching support 143, which has descended, ascends, a compression coil spring may be mounted on each of the guide bars 147.

Meanwhile, a vibration preventing unit may be provided at a lower side of the punching support 143 in order to prevent vibration generated during the punching operation of the punching head 141 from being transferred to the inspection unit 120 and the defective product marking unit 130. Thus, the inspection unit 120 is able to precisely inspect the LEDs 21 and the defective product marking unit 130 is able to precisely mark a defective LED.

Figure 6:
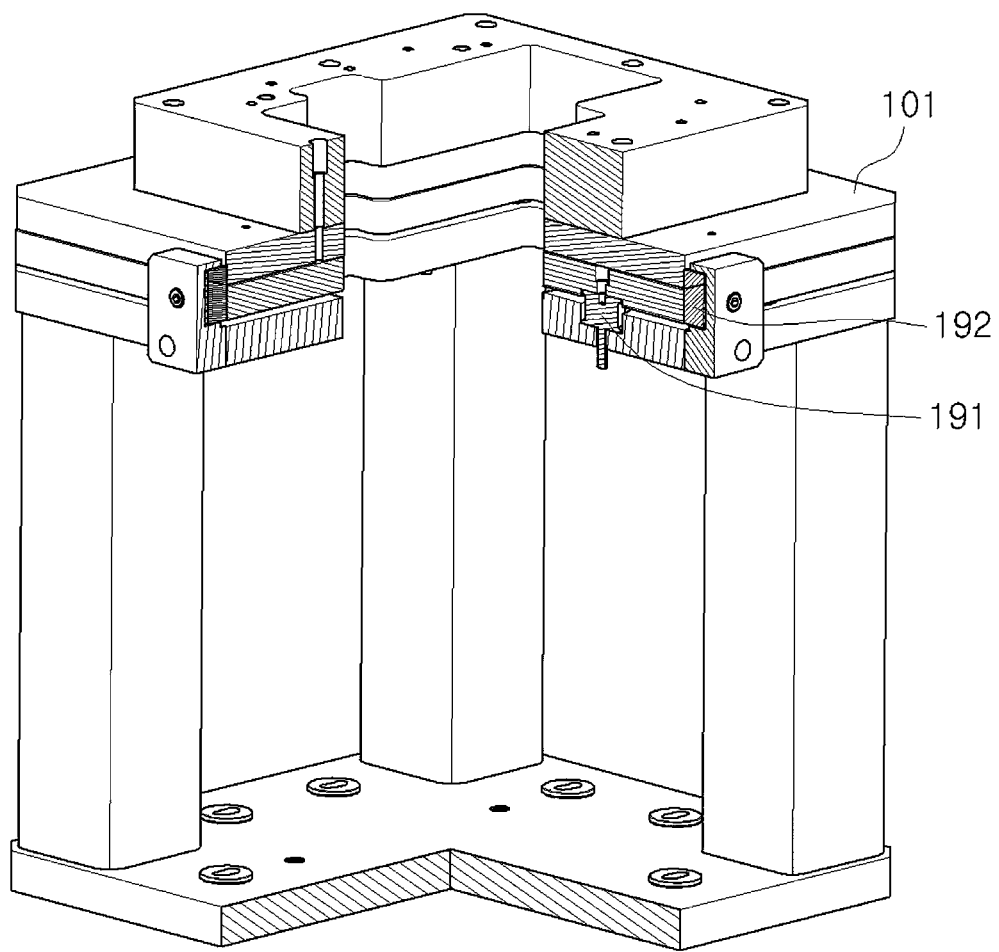
FIG. 6 is a cutaway perspective view of a vibration preventing unit of FIG. 1.

As shown in FIG. 6, the vibration preventing unit may include a vertical vibration preventing pad 191 and a horizontal vibration preventing pad 192. The vertical vibration preventing pad 191 serves to prevent vertically transferred vibrations, and the horizontal vibration preventing pad 192 serves to prevent horizontally transferred vibrations. The vertical and horizontal vibration preventing pads 191 and 192 are assembled within the frame 101 supporting the defective product rejection unit 140 to prevent vibrations generated during the punching operation of the punching head 141 from being transferred to the defective product marking unit 130.

Figure 7:
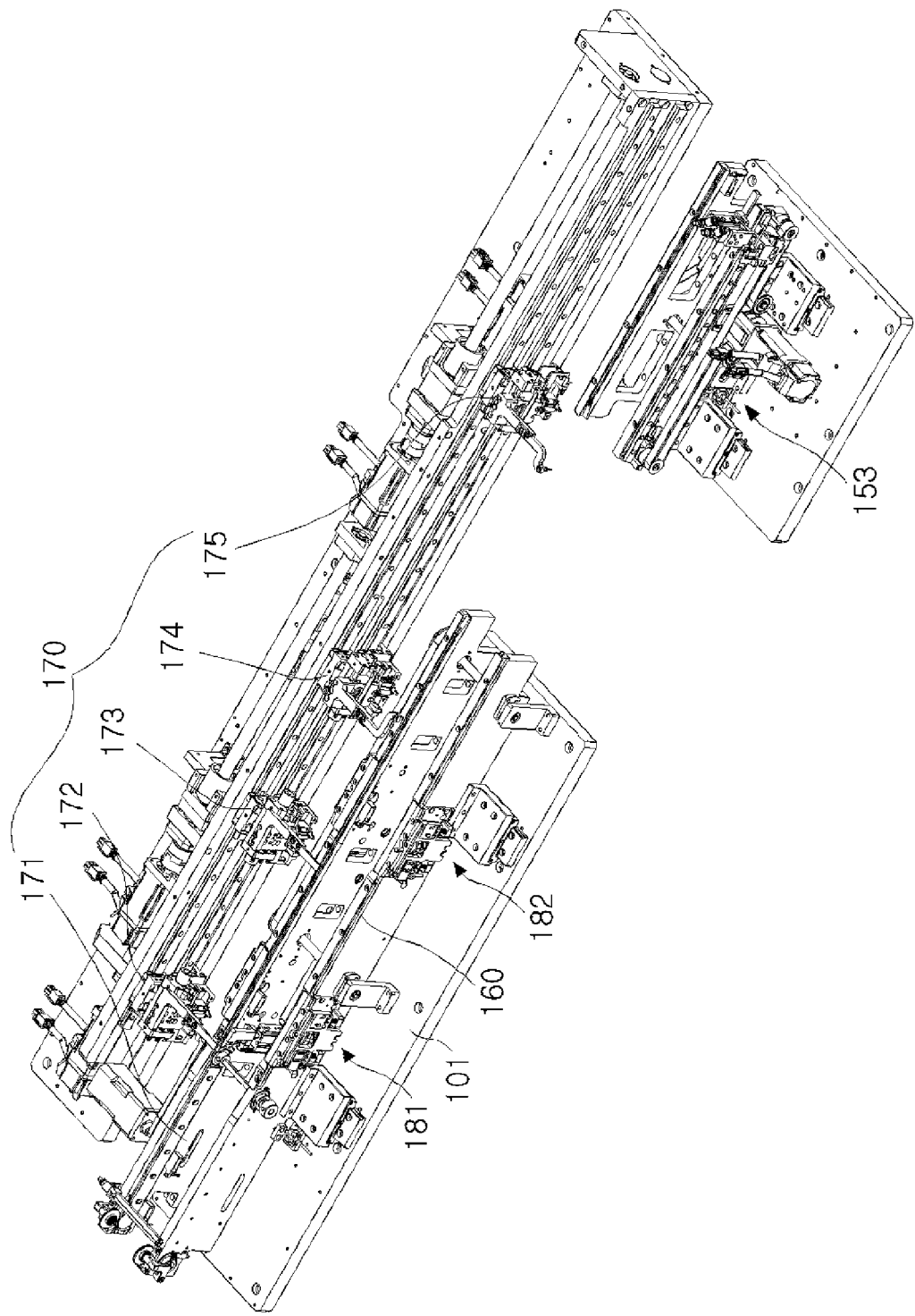
FIG. 7 is a perspective view of a transfer rail and a transfer unit in FIG. 1.

Meanwhile, the apparatus 100 for inspecting an LED may include a transfer guide rail 160 and a transfer unit 170. As shown in FIG. 7, the LED aggregate 20 supplied from the loading unit 1010 is mounted on the transfer guide rail 160 so as to be guided. The transfer unit 170 serves to transfer the LED aggregate 20 mounted on the transfer guide rail to the inspection unit 120, the defective product marking unit 130, and the defective product rejection unit 140.

A plurality of transfer units 170 may be provided. For example, the transfer unit 170 may include a first transfer unit 171 for transferring the LED aggregate 20 supplied from the loading unit 110 to the inspection unit 120, a second transfer unit 172 for transferring the LED aggregate 20 from an inspection area of the inspection unit 120, a third transfer unit 173 for transferring the LED aggregate 20 from a marking area of the defective product marking unit 130, a fourth transfer unit 174 for transferring the LED aggregate 20 from a punching area of the defective product rejection unit 140, and a fifth transfer unit 175 for transferring from the defective product rejection unit 140 to the unloading unit 150. The first to fifth transfer units 171 to 175 may be configured to operate separately.

The first transfer unit 171 may be configured to include a transfer belt allowing the LED aggregate 20 to be mounted thereon and transferred, a motor rotating the transfer belt, and a pair of guide rollers for the guiding and supplying of the LED aggregate 20 from the loading unit 110.

The second transfer unit 172 may be configured to include a picker, a linear motion guide, and a linear motor. The picker has a structure in which hook units are inserted into a plurality of holes formed along both edges of the LED aggregate 20. The linear motion guide guides the picker to move forward and backward along a direction in which the LED aggregate 20 is transferred. The linear motor moves the picker in a state in which the hook units are insertedly positioned in the holes of the LED aggregate 20, to thus transfer the LED aggregate 20.

When the inspection unit 120 inspects the LEDs 21 by one row at a time, the linear motor may be formed as a linear step motor to transfer the LEDs 21 by one row at a time. Like the second transfer unit 172, the third to fifth transfer units 173 to 175 may also be configured to include a picker, a liner motion guide, and a linear motor.

A clamping unit 181 for the inspection unit (referred to as an 'inspection unit clamping unit 181', hereinafter) may be provided to the inspection unit 120. The inspection unit clamping unit 181 tightly fixes the LED aggregate 20 to the transfer guide rail 160 situated at the inspection unit 120 while the LEDs 21 of the LED aggregate 20 are being inspected by the inspection unit 120, namely, while images of the LEDs 21 of the LED aggregate 20 are being captured. Accordingly, the inspection unit 120 can acquire precise images of the LEDs 21.

For example, the inspection unit clamping unit 181 may be configured to include a clamp member moving from an upper side of the transfer guide rail 160 to be close to the transfer guide rail 160 or separated from the transfer guide rail 160 and a clamp driving unit moving the clamp. The clamp driving unit may include a solenoid type actuator.

A clamping unit 182 for the defective product marking unit 130 (referred to as a 'defective product marking unit clamping unit 182', hereinafter) may be provided to the defective product marking unit 130. The defective product marking unit clamping unit 182 tightly fixes the LED aggregate 20 situated at the defective product marking unit 130 to the transfer guide rail 160 while the LED 21, determined to be defective, is marked as being defective by the defective product marking unit 130. Accordingly, the defective product marking unit 103 can precisely mark the defective LED 21 defective. Like the inspection unit clamping unit 181, the defective product marking unit clamping unit 182 may be also configured to include a clamp member and a clamp driving unit.

Figure 8:
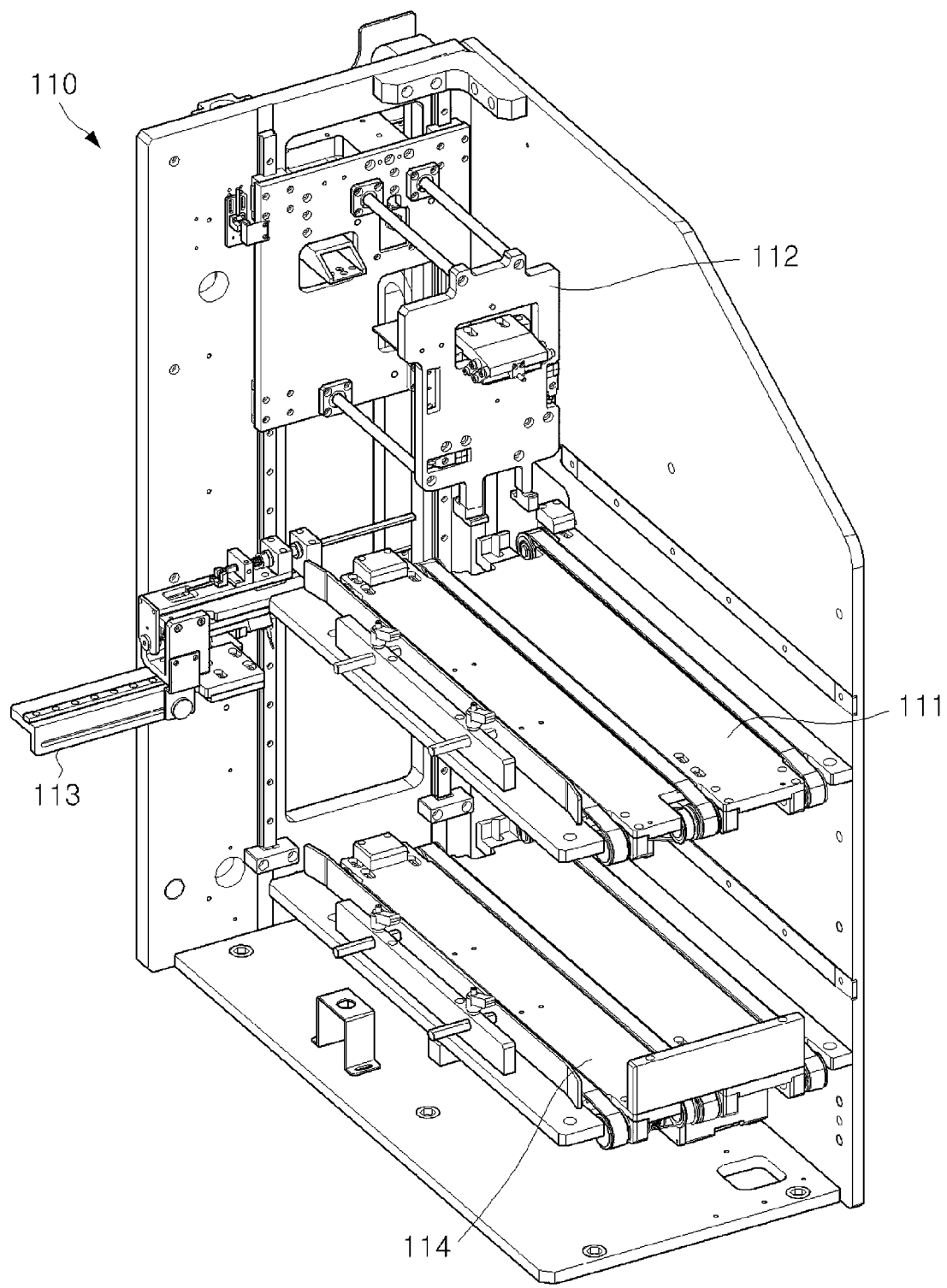
FIG. 8 is a perspective view of a loading unit in FIG. 1.
Figure 9:
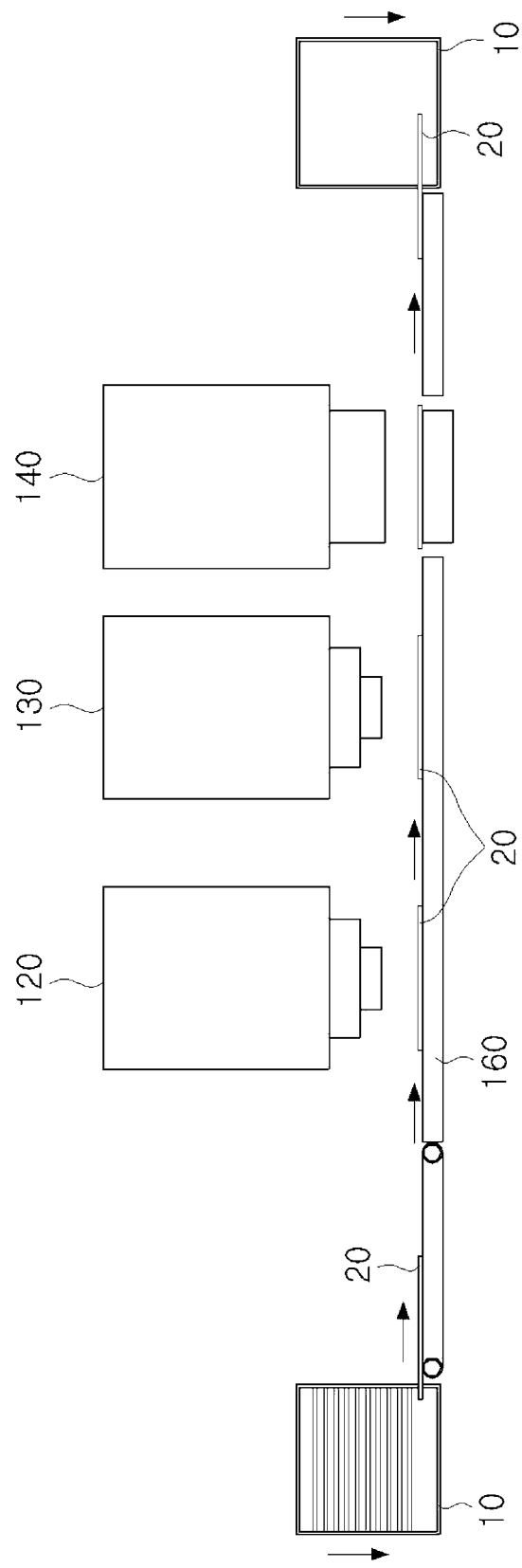
FIG. 9 is a view for explaining a process of transferring an LED aggregate in FIG. 1.

As shown in FIG. 8, the loading unit 110 may include a first supply conveyer 111, a first elevator 112, a first pusher 113, and a first discharge conveyer 114. When the cassette 10 in which the plurality of LED aggregates 20 are received in a stacked manner is loaded, the first supply conveyer 111 allows the cassette 10 to be mounted thereon and supplies the same to a supply position of the LED aggregates 20. The first elevator 112 serves to grasp the cassette 10 supplied by the first supply conveyer 111 and lift it.

The first elevator 112 may be controlled to lift or lower the grasped cassette 10 one step at a time. As illustrated, when the first discharge conveyer 114 is disposed below the first supply conveyer 111, the first elevator 112 can be controlled to lower the grasped cassette 10 one step at a time. Here, the interval of the one-step movement of the first elevator 112 corresponds to the interval at which the LED aggregates 20 are stacked.

The first elevator 112 may move to become close to or to be separated from the first supply conveyer 111 by the driving unit so as to receive the cassette 10 from the first supply conveyer 111 and be returned to its original state. Accordingly, an empty cassette 110 can be transferred from the first elevator 112 to the first discharge conveyer 114.

Each time the grasped cassette 10 is lowered one step at a time by the first elevator 112, the first pusher 113 supplies the LED aggregates 20 received in the grasped cassette 10 by one at a time to the inspection unit 120. The first pusher 113 may be configured to include a pushing member for moving forward and backward along a direction in which the LED aggregate 20 is supplied and a pushing member driving unit for moving the pushing member. The pushing member driving unit may be configured as various actuators so long as they can linearly move the pushing member.

The first discharge conveyer 114 serves to receive the empty cassette 10 from the first elevator 112 and discharge it. When the loading unit 110 is configured as described above, the LED aggregates 20 can be continuously automatically supplied to the inspection unit 120, improving production efficiency.

With reference to FIGS. 1 and 7, like the loading unit 110, the unloading unit 150 may include a second supply conveyer 151, a second elevator 152, a second pusher 153, and a second discharge conveyer 154 in order to automatically receive the LED aggregates to the empty cassette 10 and discharge them.

The second supply conveyer 151 may supply the empty cassette 10 to a discharge position of the LED aggregate 20. The second elevator 152 serves to grasp the cassette 10 supplied by the second supply conveyer 151 and lift it.

When the second discharge conveyer 154 is disposed below the second supply conveyer 151, the second elevator 152 may be controlled to lower the grasped cassette 10 one step at a time. The second elevator 152 may move to become close to, or separated from, the second supply conveyer 151 by the driving unit so as to receive the empty cassette 10 from the second supply conveyer 151 and be returned to its original state. Accordingly, the cassette 110 having the LED aggregates 20 accommodated therein can be transferred from the second elevator 152 to the second discharge conveyer 154.

Each time the grasped cassette 10 is lowered one step at a time by the second elevator 152, the second pusher 153 supplies the LED aggregates 20 transferred from the defective product rejection unit by one at a time to the inspection unit 120. The second pusher 153 may be configured to include a pushing member for moving forward and backward along a direction in which the LED aggregate 20 is supplied and a pushing member driving unit for moving the pushing member. The pushing member driving unit may be configured as various actuators so long as they can linearly move the pushing member.

The second discharge conveyer 154 serves to receive the cassette 10 having the LED aggregates 20 accommodated therein from the second elevator 152 and discharge them. When the unloading unit 150 is configured as described above, the LED aggregates 20, which have undergone the inspecting operation, the defective product marking operation, and the discarding operation, can be continuously automatically supplied to the unloading unit 150, improving production efficiency.

The operation of the apparatus 100 for inspecting an LED package having the construction as described above will now be described briefly with reference to FIGS. 1 to 9.

First, the cassette 10 in which the plurality of LED aggregates 20 to be inspected are received in a stacked manner is loaded on the loading unit 110. Then, the first supply conveyer 111 moves the cassette 10 toward the first elevator 112, and the first elevator 112 moves toward the first supply conveyer 111 to grasp the cassette 10 and be returned to its original state. Thereafter, the first elevator 112, lowers the cassette 10 one step at a time, and each time the cassette 10 is lowered one step at a time, the first pusher 113 supplies the LED aggregates 20 by one at a time from the cassette 10 to the first transfer unit 171. Then, the first transfer unit 171 transfers the LED aggregate 20 toward the inspection unit 120.

The inspection unit 120 processes an image obtained by capturing images of the LEDs 21 of the supplied LED aggregate 20 to check a charged state of the fluorescent silicon 25. In this case, the second transfer unit 172 may transfer the LED aggregate 20 such that the LEDs 21 can be sequentially inspected by one row or by a plurality of rows at a time. While the inspection unit 120 captures the images of the LEDs 21, the inspection unit clamping unit 181 fixes the LED aggregate 20.

When the second transfer unit 172 supplies the inspection-completed LED aggregate 20 to the defective product marking unit 130, the defective product marking unit 130 marks an LED determined to be defective based on the inspection results from the inspection unit 120 defective. In this case, the third transfer unit 173 may move the LEDs 21 by one row or by a plurality of rows at a time, and accordingly, the defective product marking unit 130 may move a laser beam to mark the defective LED defective. While the defective product marking unit 130 is marking the defective LED defective, the defective product marking unit clamping unit 182 fixes the LED aggregate 20. Meanwhile, if the defective product marking unit 130 is omitted, the defective product marking process can be also omitted.

When the third transfer unit 173 supplies the defective product marking-completed LED aggregate 20 to the defective product rejection unit 140, the defective product rejection unit 140 punches the LED(s) marked to be defective to discard it. In this case, the fourth transfer unit 174 moves the LEDs 21 by one row at a time, and accordingly, the defective product rejection unit 140 selectively punches the LED(s) marked to be defective among the LEDs 21 of the respective rows.

When the fifth transfer unit 175 discharges the LED aggregate 20, of which defective LED(s) have been discarded by the defective product rejection unit 140, to the unloading unit 150, the second pusher 153 the LED aggregate 20 to the empty cassette 10 which have been transferred to the second elevator 152 by the second supply conveyer 151 from the unloading unit 150. In this case, the second elevator 152 lowers the cassette 10 one step at a time, and each time the cassette 10 is lowered one step at a time, the second pusher 153 pushes the LED aggregates 20, which have undergone the defective product rejection operation in the defective product rejection unit 140, to an empty space of the cassette 10 one by one. When the LED aggregates 20 are completely accommodated in the cassette 10, the second elevator 152 transfers the cassette 10 to the second discharge conveyer 154, and the second discharge conveyer 154 then discharges the cassette 10.

As set forth above, according to exemplary embodiments of the invention, the overall process of inspecting LEDs and discarding an LED determined to be defective on the basis of inspection results in the fabrication process of LEDs can be automated. In addition, the sequential processes of inspecting LEDs and discarding defective LEDs can be quickly performed. Thus, the productivity in fabricating LEDs can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. An apparatus for inspecting a light emitting diode (LED) package, the apparatus comprising:
   an inspection unit configured to inspect a plurality of LEDs through a visual inspection to determine whether or not the plurality of LEDs are defective; and
   a defective product rejection unit including a punching pin and a discharge hole, the defective product rejection unit being configured to cause the punching pin to punch a defective LED determined to be defective on the basis of inspection results from the inspection unit among the plurality of LEDs supplied from the inspection unit and discard the defective LED punched by the punching pin into the discharge hole,
   wherein the plurality of LEDs are arranged in a plurality of rows and a plurality of columns to configure an LED aggregate connected in the form of an array, and
   the defective product rejection unit comprises:
   a punching head driven to ascend or descend;
   a plurality of punching pins arranged to correspond to the positions of the plurality of LEDs arranged in unit areas of the LED aggregate supplied by a certain number of rows in a column direction of the array, installed on the punching head so as to be driven to ascend or descend, and maintained to be selectively protruded over the defective LED among the plurality of LEDs in the unit areas when the punching head performs a punching operation; and
   a punching support supporting the LED aggregate at a lower side of the plurality of punching pins and including the plurality of discharge holes into which the punching pins lowered while being maintained in the protruded state are inserted to discharge the defective LED punched by the punching pin.

2. The apparatus of claim 1, wherein the defective product rejection unit punches and discards only the defective LED determined to be defective among the LED aggregate.

3. The apparatus of claim 1, wherein when the punching head performs the punching operation, the punching support is lowered by a pre-set distance to thus reduce an impact generated during the punching operation.

4. The apparatus of claim 1, wherein a vibration preventing unit is provided at a lower side of the punching support in order to prevent vibrations generated during the punching operation of the punching head from being transferred to the inspection unit.

5. The apparatus of claim 1, wherein a waste box is provided to collect the defective LED dropped through the discharge holes.

6. The apparatus of claim 1, wherein each of the plurality of LEDs is an LED package having a fluorescent material-containing resin part.

7. The apparatus of claim 6, wherein the inspection unit processes an image of the LED package to inspect a charged state of the fluorescent material-containing resin part.

8. The apparatus of claim 1, further comprising:
   a transfer guide rail allowing the LED aggregate to be mounted thereon and guiding the LED aggregate; and
   a transfer unit transferring the LED aggregate mounted on the transfer guide rail to the inspection unit and the defective product rejection unit.

9. The apparatus of claim 8, further comprising:
   an inspection unit clamping unit tightly attaching and fixing the LED aggregate situated at the inspection unit to the transfer guide rail, while the plurality of LEDs of the LED aggregate are being inspected by the inspection unit.

10. The apparatus of claim 1, further comprising: a loading unit loading a cassette, in which a plurality of LED aggregates are received, thereon.

11. The apparatus of claim 10, wherein the loading unit comprises:
    a first supply conveyer supplying the cassette in which the plurality of LED aggregates are received in a stacked manner to a supply position of the LED aggregates;
    a first elevator grasping the cassette, which has been supplied by the first supply conveyer, and lifting or lowering the cassette one step at a time;
    a first pusher supplying the LED aggregates received in the cassette grasped by the first elevator one by one to the inspection unit, whenever the grasped cassette is lifted or lowered one step at a time; and
    a first discharge conveyer receiving an empty cassette from the first elevator and discharging the received the empty cassette.

12. The apparatus of claim 10, further comprising:
    an unloading unit loading a cassette for receiving the plurality of LED aggregates, of which LEDs determined to be defective have been discharged through the defective product rejection unit.

13. The apparatus of claim 12, wherein the unloading unit comprises:

a second supply conveyer supplying the cassette to a discharge position of the LED aggregates;

a second elevator grasping the cassette supplied by the second supply conveyer and lifting or lowering the cassette one step at a time;

a second pusher pushing the LED aggregates, which are discharged from the defective product rejection unit, into an empty receiving space of the cassette grasped by the second elevator each time the grasped is lifted or lowered one step at a time; and a second discharge conveyer receiving the cassette in which the LED aggregates are accommodated therein from the second elevator and discharging the received cassette.

14. The apparatus of claim 1, further comprising:
a defective product marking unit marking the defective LED.

15. The apparatus of claim 14, wherein:
a transfer guide rail is provided to allow the LED aggregate to be mounted thereon and guide the the LED aggregate, and a defective product marking unit clamping unit is provided to tightly fix the LED aggregate situated at the defective product marking unit to the transfer guide rail, while the defective product marking unit marks the defective LED.

16. The apparatus of claim 14, wherein the defective product marking unit irradiates a laser beam to the surface of the defective LED to carve a stamp of a defect mark thereon, or jets ink to the surface of the defective LED to print a defect mark thereon.

17. A method for inspecting a light emitting diode (LED) package by using an LED inspection apparatus including a punching pin and a discharge hole, the method comprising:
inspecting a plurality of LEDs through a visual inspection to determine whether or not the plurality of LEDs are defective; and
causing the punching pin to punch a defective LED determined to be defective according to results of the inspection such that the defective LED is discarded into the discharge hole, wherein: the plurality of LEDs are arranged in a plurality of rows and a plurality of columns to configure an LED aggregate connected in the form of an array, and in the discarding of the defective LED determined to be defective, only the defective LED determined to be defective among the LED aggregate is punched and discarded, and
the discarding of the defective LED is performed by a defective product rejection unit comprising:
a punching head driven to ascend or descend, a plurality of punching pins arranged to correspond to the positions of the plurality of LEDs arranged in unit areas of the LED aggregate supplied by a certain number of rows in a column direction of the array, installed on the punching head so as to be driven to ascend or descend, and maintained to be selectively protruded over the defective LED determined to be defective among the plurality of LEDs in the unit areas when the punching head performs a punching operation, and a punching support supporting the LED aggregate at a lower side of the plurality of punching pins and including a plurality of discharge holes into which the punching pins lowered while being maintained in the protruded state are inserted to discharge the defective LED punched by the punching pin.

18. The method of claim 17, wherein when the punching head performs the punching operation, the punching support is lowered by a pre-set distance to thus reduce an impact generated during the punching operation.

19. The method of claim 17, wherein a vibration preventing unit is provided at a lower side of the punching support in order to prevent vibrations generated during the punching operation of the punching head from being transferred to the inspection unit.

20. The method of claim 17, wherein a waste box is provided to collect the defective LED dropped through the discharge holes.

21. The method of claim 17, wherein each of the plurality of LEDs is an LED package having a fluorescent material-containing resin part.

22. The method of claim 21, wherein in the inspecting of the LED packages, a charged state of a fluorescent material-containing resin part is inspected by processing a captured images of each of the LED packages.

23. The method of claim 17, further comprising:
loading a cassette, in which a plurality of LED aggregates are received, before the inspecting operation; and
supplying the plurality of LED aggregates from the cassette to an area for the visual inspection.

24. The method of claim 23, wherein the supplying of the LED aggregates to the area for a visual inspection is performed by a loading unit which comprises:
a first supply conveyer supplying the cassette in which the plurality of LED aggregates are received in a stacked manner to a supply position of the LED aggregates;
a first elevator grasping the cassette, which has been supplied by the first supply conveyer, and lifting or lowering the cassette one step at a time;
a first pusher supplying the LED aggregates received in the cassette grasped by the first elevator one by one to the inspection unit, whenever the grasped cassette is lifted or lowered one step at a time; and
a first discharge conveyer receiving an empty cassette from the first elevator and discharging the empty cassette.

25. The method of claim 17, further comprising:
unloading the LED aggregate, of which the defective LED determined to be defective has been discarded, to a cassette.

26. The method of claim 25, wherein the unloading of the LED aggregate to the cassette is performed by an unloading unit which comprises:
a second supply conveyer supplying the cassette to a discharge position of the LED aggregate;
a second elevator grasping the cassette supplied by the second supply conveyer and lifting or lowering the cassette one step at a time;
a second pusher pushing the LED aggregate, which is discharged from the defective product rejection unit, into an empty receiving space of the cassette grasped by the second elevator each time the grasped is lifted or lowered one step at a time; and
a second discharge conveyer receiving the cassette in which the LED aggregate is accommodated therein from the second elevator and discharging the received cassette.

27. The method of claim 26, further comprising:
marking the defective LED, which has been determined to be defective on the basis of inspection results from the inspection unit, among the plurality of LEDs of the LED aggregate supplied from the inspection unit, defective.

28. The method of claim 27, wherein in the marking of the defective LED, laser beam is irradiated to the surface of the defective LED to carve a stamp of a defect mark thereon, or ink is jetted to the surface of the defective LED print a defect mark thereon.

* * * * *